(12) United States Patent
Jang et al.

(10) Patent No.: US 7,683,681 B2
(45) Date of Patent: Mar. 23, 2010

(54) INJECTION-LOCKED FREQUENCY DIVIDER EMBEDDED AN ACTIVE INDUCTOR

(75) Inventors: Sheng-Lyang Jang, Taipei (TW); Cheng-Chen Liu, Taipei (TW); Jui-Cheng Han, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 86 days.

(21) Appl. No.: 11/954,213

(22) Filed: Dec. 12, 2007

(65) Prior Publication Data

US 2008/0278204 A1 Nov. 13, 2008

(30) Foreign Application Priority Data

May 8, 2007 (TW) .............................. 96116267 A

(51) Int. Cl.
*H03B 19/06* (2006.01)
(52) U.S. Cl. ..................... 327/118; 333/214; 333/217; 331/107 R; 331/108 R; 331/116; 331/117 FE; 331/117 R; 331/167; 331/177 R
(58) Field of Classification Search ............... 327/118; 333/214, 217; 331/107 R, 108 R, 116, 117 FE, 331/117 R, 167, 177 R
See application file for complete search history.

(56) References Cited

U.S. PATENT DOCUMENTS

| | | | |
|---|---|---|---|
| 7,042,317 B2 * | 5/2006 | Xiao et al. ................... 333/214 |
| 7,075,380 B2 * | 7/2006 | Singh et al. .............. 331/117 R |
| 7,139,540 B2 * | 11/2006 | Wu et al. .................. 455/251.1 |
| 7,161,439 B2 * | 1/2007 | Paillet et al. .................... 331/57 |
| 7,403,075 B2 * | 7/2008 | Mukhopadhyay et al. ..... 331/76 |
| 2004/0227573 A1 * | 11/2004 | Soda ........................... 330/253 |
| 2005/0264356 A1 * | 12/2005 | Kucharski et al. ............ 330/252 |
| 2006/0044099 A1 * | 3/2006 | Gill .............................. 336/130 |
| 2006/0181356 A1 * | 8/2006 | Park et al. ...................... 331/45 |
| 2008/0278204 A1 * | 11/2008 | Jang et al. .................... 327/118 |

OTHER PUBLICATIONS

Author: Liang-Hung Lu, Hsieh_Hung Hsieh, Yu-Te Liao Title: A Wide tuning-Range CMOS VCO With a Differential Tunable Active Inductor Date: Sep. 2006 Publisher, Volume: IEEE Transactions on Microwave Theory and Techniques, vol. 54, No. 9, Sep. 2006.*

(Continued)

*Primary Examiner*—Arnold Kinkead
*Assistant Examiner*—Richard Tan
(74) *Attorney, Agent, or Firm*—Jianq Chyun IP Office

(57) ABSTRACT

An injection-locked frequency divider is provided. The injection-locked frequency divider includes an active inductor unit, a source injection unit, a first transistor and a second transistor. The injection-locked frequency divider generates a frequency-divided signal having a half frequency of the signal source. A locking frequency range of the injection-locked frequency divider is determined by a quality factor of a resonant cavity. A quality factor of the active inductor unit is lower than a conventional spiral inductor because the active inductor unit is composed of active elements. In the injection-locked frequency divider, the active inductor unit is used to instead of the conventional spiral inductor, so that the chip area can be reduced and the locking frequency range of the injection-locked frequency divider can be increased. Further, an induction value of the active inductor unit can be altered to change the locking frequency range of the injection-locked frequency divider.

13 Claims, 7 Drawing Sheets

OTHER PUBLICATIONS

Article titled "Reconfigurable RFICs in Si-Based Technologies for a Compact Intelligent RF Front-End" authored by Mukhopadhyay et al., IEEE Transactions on Microwave Theory and Techniques, vol. 53, No. 1 Jan. 2005, (pp. 81-93).

Article titled "Improved Quality-Factor of 0.18-µm CMOS Active Inductor by a Feedback Resistance Design" authored by Hsiao et al., IEEE Microwave and Wireless Components Letters, vol. 12, No. 12 Dec. 2002, (pp. 467-469).

Article titled "An Ultra-Wideband CMOS VCO with 3~5 GHz Tuning Range s5.4" authored by Wei et al., IEEE International Workshop on Radio-Frequency Integration Technology, Nov. 30-Dec. 2, 2005, Singapore (pp. 87-90).

Article titled "A Wide Tuning-Range CMOS VCO With a Differential Tunable Active Inductor" authored by Lu et al., IEEE Transactions on Microwave Theory and Techniques, vol. 54, No. 9, Sep. 2006 (pp. 3462-3468).

* cited by examiner

INJECTION-LOCKED FREQUENCY DIVIDER EMBEDDED AN ACTIVE INDUCTOR

CROSS-REFERENCE TO RELATED APPLICATION

This application claims the priority benefit of Taiwan application serial no. 96116267, filed on May 8, 2007. The entirety of the above-mentioned patent application is hereby incorporated by reference herein and made a part of this specification.

BACK GROUND OF THE INVENTION

1. Field of the Invention

The present invention relates to an injection-locked frequency divider, and more particularly, to an injection-locked frequency divider comprising an active inductor unit.

2. Description of Related Art

Frequency dividers are widely used in mixed signal integrated circuits. For example, the frequency dividers are included in essential elements in a multiplexer, a phase locked loop, a clock generator and a frequency synthesizer. Presently, the frequency dividers are classified into a Common Mode Logic (CML) frequency divider, a dynamic logic frequency divider, a Miller divider and an injection-locked frequency divider, and so on.

As described above, the common mode logic frequency divider and the Miller divider not only expend a lot of electricity but also generate large quantities of waste heat due to their high power-consumption, and thus render the system unstable. Although the dynamic logic frequency divider expends less power, it isn't suitable for the operation of high-speed system because of its low operating frequency. It should be noted that the injection-locked frequency divider has not only higher operating frequency, but also consume less power compared to the common mode logic frequency divider and the Miller divider, so that the injection-locked frequency divider rises from various kinds of frequency dividers.

FIG. 1 is a circuit diagram of a conventional injection-locked frequency divider. Referring to the FIG. 1, the injection-locked frequency divider 10 may include two portions of a spiral inductor type voltage controlled oscillator (VCO) 20 and a source injection unit 30. The spiral inductor type voltage controlled oscillator 20 consists of spiral inductors (called passive inductors) 101 and 102, varactors 111 and 112, and transistors 121 and 122. The source injection unit 30 consists of a transistor 123. The source injection unit 30 receives signal source of a frequency $f_0$ by an end A, and the injection-locked frequency divider 10 outputs a signal source of a frequency $f_0/2$ to ends B and C respectively. It should be noted that although the spiral inductor type voltage controlled oscillator 20 uses varactor 111 and 112 to adjust oscillation frequency, it can not increase the locking range of the injection-locked frequency divider 10 effectively. On the other hand, as the areas of the spiral inductor 101 and 102 are very large, the injection-locked frequency divider 10 must occupy a larger chip area and increase the manufacturing cost.

Therefore, how to overcome the above problems is an important issue for manufacturers in the field.

SUMMARY OF THE INVENTION

The present invention provides an injection-locked frequency divider for reducing chip layout area.

The present invention provides an injection-locked frequency divider, which includes a first active inductor unit, a first source injection unit, a first transistor and a second transistor. A first terminal of the first active inductor unit is coupled to a first voltage. A first terminal of the first source injection unit receives a signal source, and a second terminal and a third terminal of the first source injection unit are respectively coupled to second terminal and a third terminal of the first active inductor unit. A first terminal, a gate terminal and a second terminal of the first transistor are respectively coupled to the second terminal and the third terminal of the first source injection unit and a second voltage. A first terminal, a gate terminal, and a second terminal of the second transistor are respectively coupled to the third terminal and the second terminal of the first source injection unit and the second voltage. Wherein, the injection-locked frequency divider generates a frequency-divided signal, which has a frequency of half of the signal received from the first terminal of the first source injection unit.

In an embodiment of the present invention, the first active inductor unit includes a first current source, a second current source, a third transistor, a fourth transistor, a fifth transistor and a sixth transistor. A first terminal of the first current source is coupled to the first voltage. A first terminal, a second terminal and a gate terminal of the third transistor are respectively coupled to the first voltage, the first terminal of the first transistor and a second terminal of the first current source. A first terminal, a gate terminal and a second terminal of the fourth transistor are respectively coupled to the gate terminal, the second terminal of the third transistor and a third voltage. A first terminal of the second current source is coupled to the first voltage. A first terminal, a second terminal and a gate terminal of the fifth transistor are respectively coupled to the first voltage, the first terminal of the second transistor and a second terminal of the second current source. A first terminal, a gate terminal and a second terminal of the sixth transistor are respectively coupled to the gate terminal and the second terminal of the fifth transistor and the third voltage. In an embodiment of the present invention, the first and second current sources are transistors or resistors. In another embodiment, the first active inductor unit further includes a first resistor unit and a second resistor unit. The first resistor unit is coupled between the gate terminal of the third transistor and the first terminal of the fourth transistor. The second resistor unit is coupled between the gate terminal of the fifth transistor and the first terminal of the sixth transistor. The first resistor unit includes a first resistor and a seventh transistor. The first resistor is coupled between the gate terminal of the third transistor and the first terminal of the fourth transistor. A first terminal, a second terminal and a gate terminal of the seventh transistor are respectively coupled to the gate terminal of the third transistor, the first terminal of the fourth transistor and a second bias voltage. On the other hand, the second resistor unit includes a second resistor and an eighth transistor. The second resistor is coupled between the gate terminal of the fifth transistor and the first terminal of the sixth transistor. A first terminal, a second terminal and a gate terminal of the eighth transistor are respectively coupled to the gate terminal of the fifth transistor, the first terminal of the sixth transistor and the second bias voltage. Wherein, the first and second resistor units are variable resistor units.

In an embodiment of the present invention, the first source injection unit includes a third transistor. A gate terminal of the third transistor receives a signal source, and a first terminal and a second terminal of the third transistor are respectively coupled to the second and third terminals of the first active inductor unit. In another embodiment, the injection-locked frequency divider further includes a third transistor. A first terminal of the third transistor is coupled to the second terminal of the first transistor and the second terminal of the second transistor, and a second terminal, a gate terminal of the third transistor are respectively coupled to the second voltage and a fourth bias voltage.

In an embodiment of the present invention, the first active inductor unit includes a first current source, a second current source, a third transistor, a fourth transistor, a fifth transistor and a sixth transistor. A first terminal of the first current source is coupled to a first voltage. A first terminal, a second terminal and a gate terminal of the third transistor are respectively coupled to the first voltage, the first terminal of the first transistor and a second terminal of the first current source. A first terminal of the second current source is coupled to the first voltage. A first terminal, a second terminal and a gate terminal of the fourth transistor are respectively coupled to the first voltage, the first terminal of the second transistor and a second terminal of the second current source. A first terminal, a gate terminal and a second terminal of the fifth transistor are respectively coupled to the second terminal of the second current source, and the gate terminal and the second terminal of the third transistor. A first terminal, a gate terminal and a second terminal of the sixth transistor are respectively coupled to the second terminal of the first current source, and the gate terminal and the second terminal of the fourth transistor.

In an embodiment of the present invention, the injection-locked frequency divider further includes a second active inductor unit, a second source injection unit and a third to eighth transistor. A first terminal of the second active inductor unit is coupled to a first voltage. A first terminal of the second source injection unit receives a signal source, and a second terminal and a third terminal of the second source injection unit are respectively coupled to a second and a third terminal of the second active inductor unit. A first terminal, a gate terminal and a second terminal of the third transistor are respectively coupled to the second and third terminals of the second source injection unit and a second voltage. A first terminal, a gate terminal and a second terminal of the fourth transistor are respectively coupled to the third and second terminals of the second source injection unit and the second voltage. A first terminal, a second terminal and a gate terminal of the fifth transistor are respectively coupled to the first and second terminals of the first transistor and the gate terminal of the third transistor. A first terminal, a second terminal and a gate terminal of the sixth transistor are respectively coupled to the first and second terminals of the second transistor and the gate terminal of the fourth transistor. A first terminal, a second terminal and a gate terminal of the seventh transistor are respectively coupled to the first and second terminals of the third transistor and the first terminal of the first transistor. A first terminal, a second terminal and a gate terminal of the eighth transistor are respectively coupled to the first and second terminals of the fourth transistor and the first terminal of the second transistor.

In an embodiment of the present invention, the injection-locked frequency divider further includes a first buffer unit, a second buffer unit, a third buffer unit and a fourth buffer unit. A first terminal, a second terminal and a third terminal of the first buffer unit are respectively coupled to the first voltage, and the first and second terminals of the first transistor. A first terminal, a second terminal and a third terminal of the second buffer unit are respectively coupled to the first voltage, and the first and second terminals of the second transistor. A first terminal, a second terminal and a third terminal of the third buffer unit are respectively coupled to the first voltage, and the first and second terminals of the third transistor. A first, second, third terminals of the fourth buffer unit are respectively coupled to the first voltage, and the first and second terminals of the fourth transistor.

In an embodiment of the present invention, the first and second active inductor units have the same components, the first and second source injection units have the same components, and the first to fourth buffer units have the same components. On the other hand, the first buffer unit includes an inductor and a twenty-fifth transistor. A first terminal of the inductor serves as the first terminal of the first buffer unit. A first terminal of the twenty-fifth transistor is coupled to a second terminal of the inductor, and a second terminal and a third terminal of the twenty-fifth transistor serve as the second and the third terminal of the first buffer unit.

The injection-locked frequency divider according to the present invention employs an active inductor unit, whose size is far less than that of the conventional spiral inductor. Therefore, the chip layout area is substantially reduced. These and other embodiments, features, aspects, and advantages of the present invention will be described and become more apparent from the detailed description of embodiments when read in conjunction with accompanying drawings.

DESCRIPTION OF EMBODIMENTS

Figure 1:
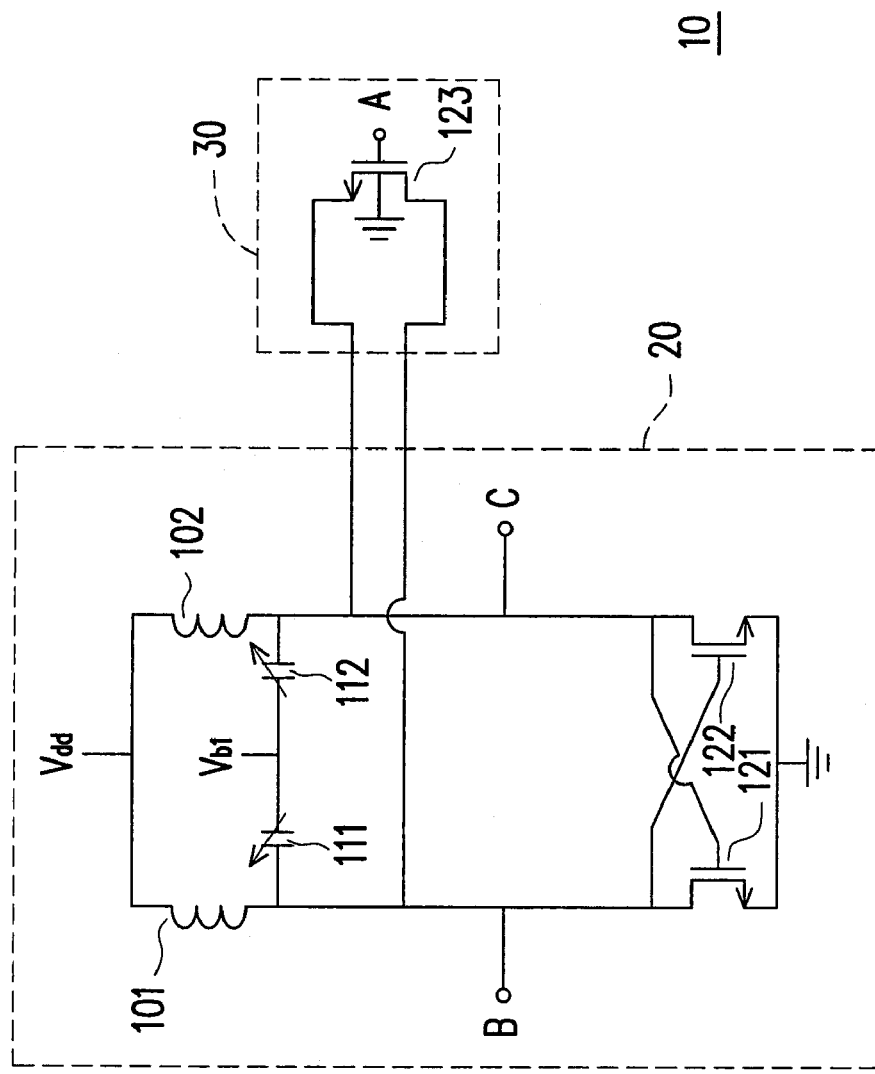
FIG. 1 is a circuit diagram of a conventional injection-locked frequency divider.
Figure 2:
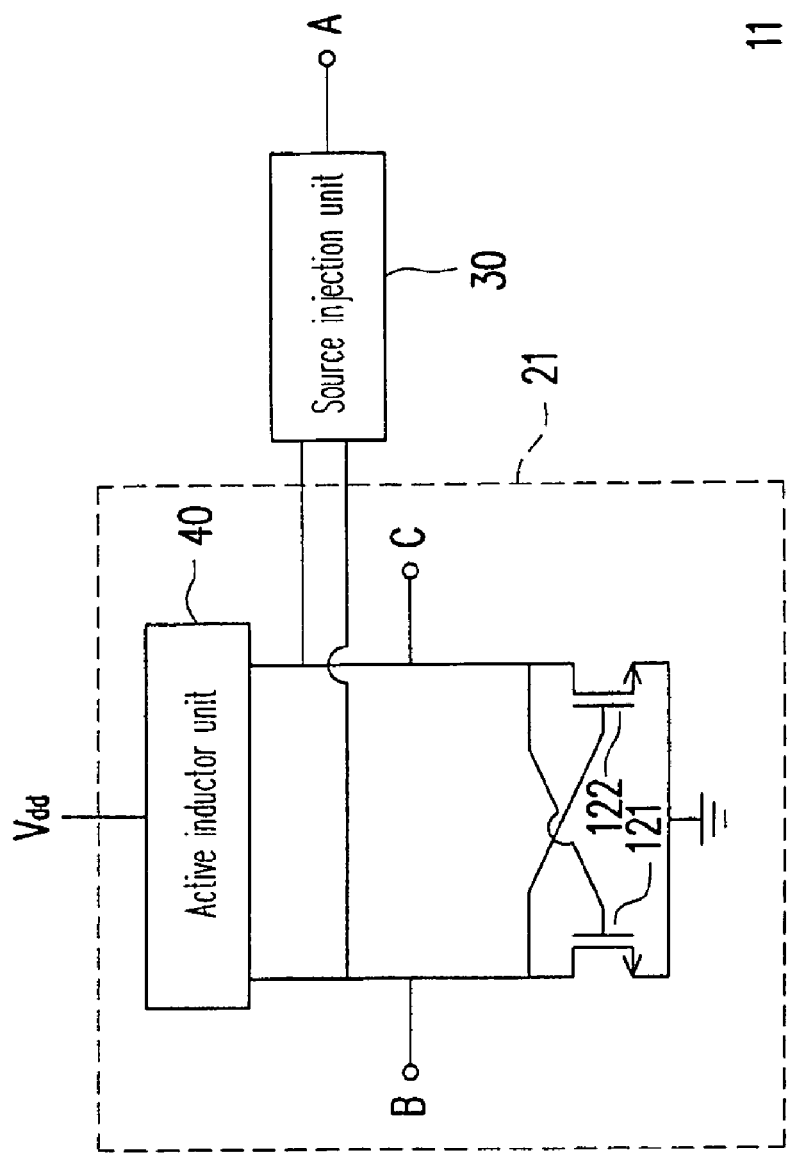
FIG. 2 is a schematic diagram of an injection-locked frequency divider according to a first embodiment of the present invention.

FIG. 2 is a schematic diagram of an injection-locked frequency divider according to a first embodiment of the present invention. Referring to FIG. 2, the injection-locked frequency divider 11 includes an active inductor type voltage controlled oscillator 21 and a source injection unit 30. The active inductor type voltage controlled oscillator 21 includes an active inductor unit 40 and transistors 121 and 122. In the present embodiment, the transistors 121 and 122 are explained using N-type metal-oxide-semiconductor transistors as an example. A first terminal, a second terminal and a third terminal of the active inductor unit 40 are respectively coupled to a voltage $V_{dd}$ and ends B and C. A first terminal of the source injection unit 30 is coupled to an end A to receive a signal source of a frequency $f_0$, and a second terminal and a third terminal of the source injection unit 30 are respectively coupled to the ends B and C. A first terminal, a gate terminal and a second terminal of the transistor 121 are respectively coupled to the ends B and C, and a ground terminal. A first terminal, a gate terminal and a second terminal of the transistor 122 are respectively coupled to the ends C and B, and the ground terminal. Wherein, the injection-locked frequency divider 11 generates a frequency-divided signal of $f_0/2$ from the ends B and C.

It should be noted that the transistors 121 and 122 are coupled in a cross-couple manner. The transistors 121 and 122 may form an equivalent negative resistance, so as to neutralize the equivalent resistance of the active inductor unit 40, and thus sustain continuous oscillations of the active inductor type voltage controlled oscillator 21. In addition, the transistors 121 and 122 derive their respective parasitic capacitances based on high frequency effect. The active inductor unit 40 and the parasitic capacitances derived from the transistors 121 and 122 then form an LC-tank. In other words, the active inductor type voltage controlled oscillator 21 employs the active inductor unit 40 instead of the conventional spiral inductor, and uses the parasitic capacitances derived by the transistors 121 and 122 instead of the conventional variable capacitor. Thus, the chip layout area can be substantially reduced, and at the same time the injection-locked frequency divider 11 can be more easily integrated into a system with other related circuit, for example, a mixer, a Phase Locked Loop (PLL), and so on.

In particular, although, in the above-described embodiment, a possible form of the injection-locked frequency divider 11 has been described, it will be understood by those of ordinary skill in the art that the designs of the injection-locked frequency divider 11 vary depending on manufacturers. Therefore, the present invention should not be limited to the above possible form. In other words, it meets with the purpose of the present invention so long as the injection-locked frequency divider 11 uses the active inductor unit 40 instead of the conventional spiral inductor. In order to clearly describe the present invention, the active inductor unit 40 and the source injection unit 30 will now be described in more detail.

Figure 3A:
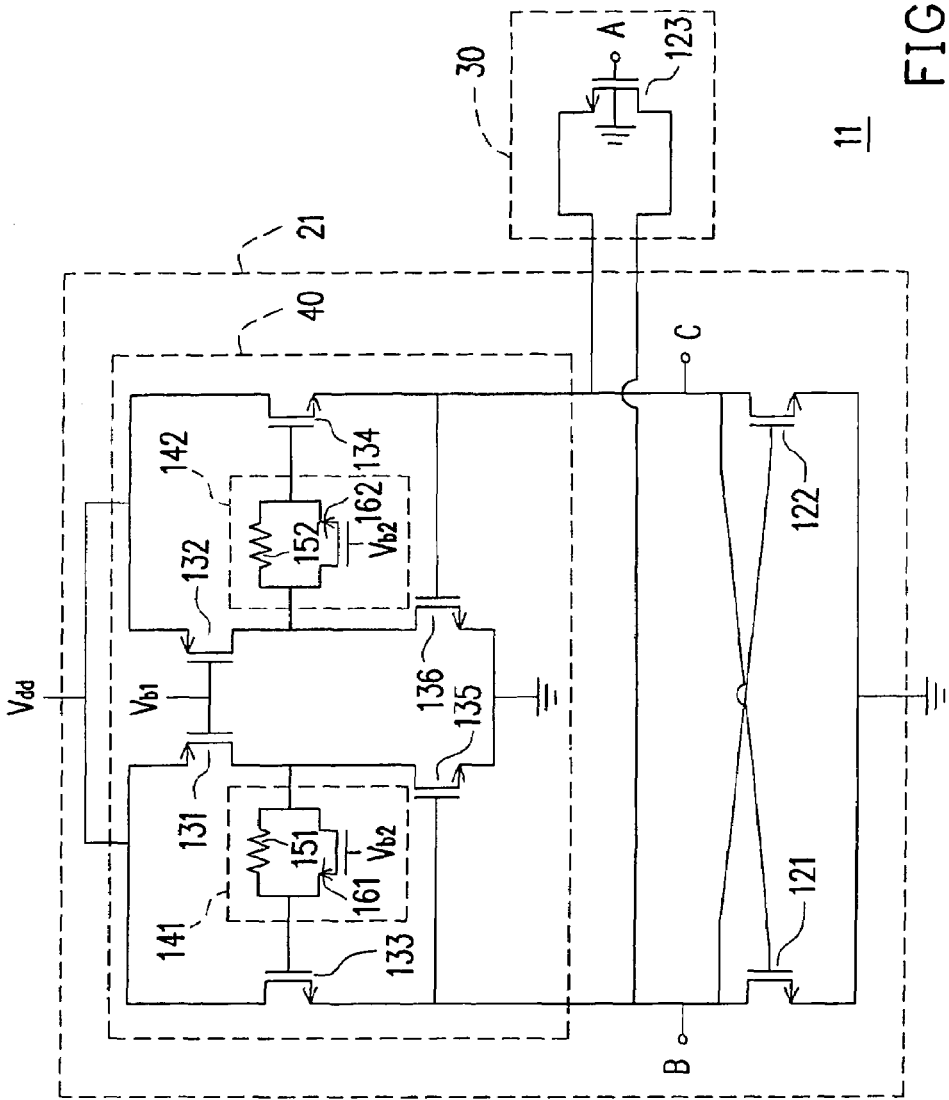
FIG. 3A is a circuit diagram of an injection-locked frequency divider according to the first embodiment of the present invention.

FIG. 3A is a circuit diagram of an injection-locked frequency divider according to a first embodiment of the present invention. Referring to FIG. 3A, in the present embodiment, the source injection unit 30 includes a transistor 123, for example, an N-type metal-oxide-semiconductor transistor, which has a gate terminal for receiving a signal source of oscillation frequency $f_0$. A first terminal and a second terminal of the transistor 123 are respectively coupled to ends B and C. When a signal source of oscillation frequency $f_0$ is injected into the gate terminal of the transistor 123, the transistor 123 turns on or off according to the amplitude of the signal source. More specifically, when the amplitude of the signal source is at high level, the transistor 123 is turned on, and it is regarded as a short circuit between the ends B and C; and when the amplitude of the signal source is at low level, the transistor 123 is turned off, and it is regarded as an open circuit between the ends B and C. When the signal source of oscillation frequency $f_0$ is injected into the gate terminal of the transistor 123, the transistor 123 operates between ON and OFF states at a frequency $f_0$.

As described above, it will be understood by those of ordinary skill in the art that a natural resonance frequency $f_{free}$ of the active inductor type voltage controlled oscillator 21 will be influenced by the signal source of frequency $f_0$. When the natural resonance frequency $f_{free}$ of the active inductor type voltage controlled oscillator 21 is close to a half of the frequency $f_0$ of the signal source received by the source injection unit 30, the injection-locked frequency divider 11 will output a frequency-divided signal, which has a half frequency of the signal source. For example, if the oscillation frequency of the signal source is $f_0$, and the natural resonance frequency $f_{free}$ of the active inductor type voltage controlled oscillator 21 is close to $f_0/2$, the injection-locked frequency divider 11 will output a frequency-divided signal of oscillation frequency $f_0/2$.

On the other hand, the active inductor unit 40 includes a first current source, a second current sources and transistors 133, 134, 135 and 136. In the present embodiment, the first and the second current sources are particularly explained using transistors 131 and 132 as an example. However, the first and second current sources may be resistors according other embodiments. We are aimed at this instance, the transistors 131 and 132 are P-type metal-oxide-semiconductor transistors, and the transistors 133-136 are N-type metal-oxide-semiconductor transistors. A first terminal and a gate terminal of the transistor 131 are respectively coupled to a voltage $V_{dd}$ and a bias voltage $V_{b1}$. A first terminal and a gate terminal of the transistor 133 are respectively coupled to the voltage $V_{dd}$ and a second terminal of the transistor 131. A first terminal, a gate terminal and a second terminal of the transistor 135 are respectively coupled to the gate terminal, a second terminal of the transistor 133 and a ground terminal. A first terminal and a gate terminal of the transistor 132 are respectively coupled to the voltage $V_{dd}$ and the bias voltage $V_{b1}$. A first terminal and a gate terminal of the transistor 134 are respectively coupled to the voltage $V_{dd}$ and a second terminal of the transistor 132. A first terminal, a gate terminal and a second terminal of the transistor 136 are respectively coupled to the gate terminal, a second terminal of the transistor 134 and the ground terminal.

Figure 4:
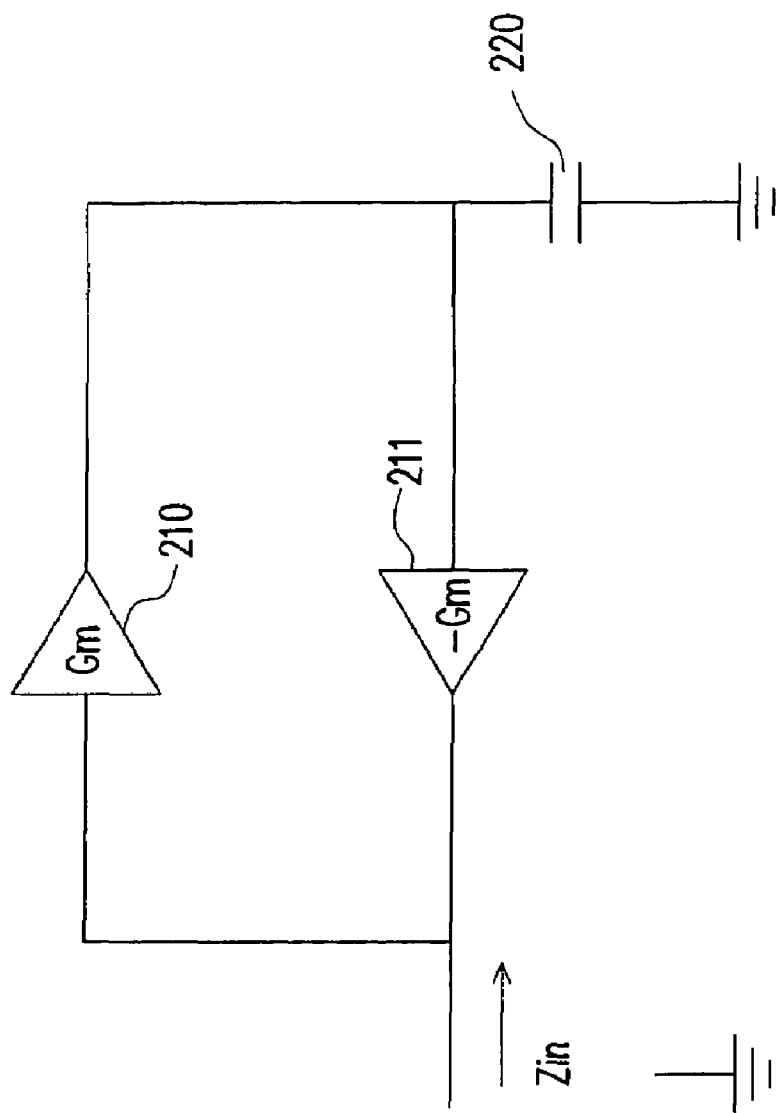
FIG. 4 is a diagram illustrating the principle and structure of an active inductor according to the first embodiment of the present invention.

FIG. 4 is a diagram illustrating the principle and structure of an active inductor according to the first embodiment of the present invention. Referring to FIGS. 3A and 4 together, amplifiers 210 and 211 in the FIG. 4, having respective gains Gm and −Gm, feedback to each other, and as a result of an equivalent impedance of a capacitor 220 is inductive from a direction indicated Zin. In other words, according to the principle, the transistors 133 and 135 of the active inductor unit 40 may be equivalent to a first inductor (called an active inductor), and the transistors 134 and 136 of the active inductor unit 40 may be equivalent to a second inductor. Thus, the active inductor unit 40 can accomplish the efficacy of the conventional spiral inductor by using an active device of considerable small chip area (for example, a transistor). In other words, the active inductor unit 40 can substantially reduce the chip layout area by using an active inductor.

Referring to FIG. 3A, those of ordinary skill in the art may modify the structure of the active inductor unit 40 so as to change the inductance values of the first, and the second inductors. For example, a resistor unit 141 may be between the gate terminal of the transistor 133 and the first terminal of the transistor 135. In the present embodiment, the resistor unit 141 is described using a variable resistor unit as an example, and the resistor unit 141 may also be a fixed resistor unit in other embodiments. The resistor unit 141 includes a resistor 151 and a transistor 161. We are aimed at this instance, the transistor 161 is an N-type metal-oxide-semiconductor transistor and the resistor 151 is a fixed resistor. The transistor 161 and the resistor 151 are connected in parallel, and a gate terminal of the transistor 161 may receive a bias voltage $V_{b2}$ to change the channel depth of the transistor 161, and thus change the resistance value of the resistor unit 141.

As described above, the resistance value of the resistor unit 141 has influence on the inductance value of the first inductor, and thus changes the oscillation frequency of the active inductor type voltage controlled oscillator 21. On the other hand, the induction values of the first, and the second inductors may be altered by changing the bias voltage Vb1 of the injection-locked frequency divider 11. Thus, the locking range of the injection-locked frequency divider 11 can be probably increased to, for example, 2 G-4 GHz. In addition, another advantage of the injection-locked frequency divider 11 is that the injection-locked frequency divider 11 can operate in a high-frequency circuit, and can be integrated into the high-frequency circuit.

Figure 3B:
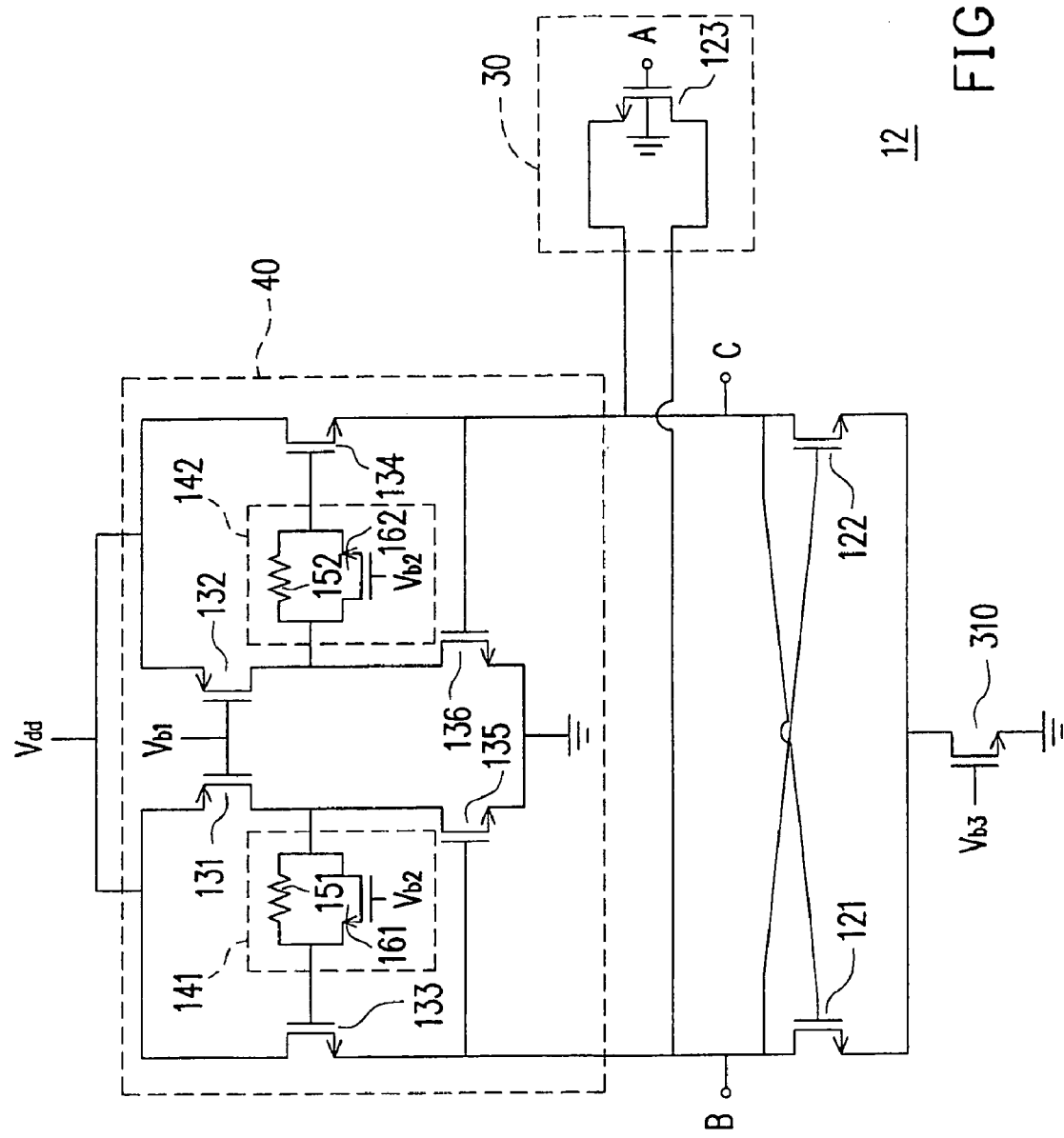
FIG. 3B is a circuit diagram of an injection-locked frequency divider according to a second embodiment of the present invention.

The various changes in implementation may be made to the injection-locked frequency divider 11 by those of ordinary skill in the art according to the spirit and teachings of the present invention. For example, FIG. 3B is a circuit diagram of an injection-locked frequency divider according to a second embodiment of the present invention. Referring to FIG. 3B, in the present embodiment, implementations of the active inductor unit 40, the source injection unit 30, and the transistors 121 and 122 may be described with reference to the first embodiment, and the description thereof is not repeated. We are aimed at this instance, the transistor 310 is an N-type metal-oxide-semiconductor transistor that have a gate terminal receiving a bias voltage $V_{b3}$, a first terminal coupled to the second terminals of the transistors 121 and 122, and a second terminal coupled to a ground terminal. The transistor 310 may be used to limit the magnitude of current flowing through an injection-locked frequency divider 12 so as to reduce the power consumption of the injection-locked frequency divider 12.

Figure 5:
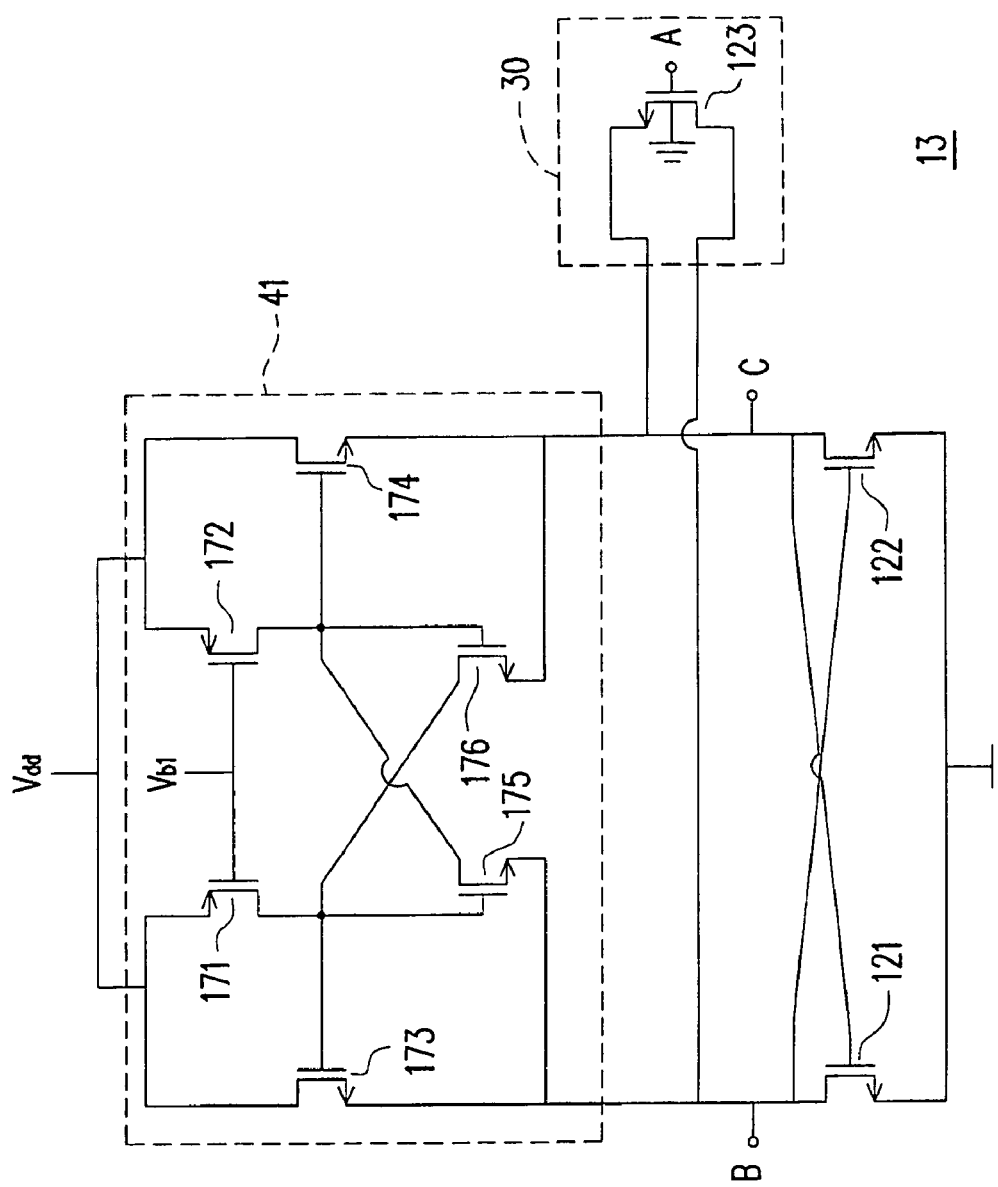
FIG. 5 is a circuit diagram of an injection-locked frequency divider according to a third embodiment of the present invention.

Although a possible form of an active inductor unit 40 has been described in the above embodiments, the active inductor unit 40 in the above embodiments is only a particular embodiment. In other embodiments, the implementation structure of the active inductor unit 40 may be modified by those of ordinary skill in the art based on their needs. For example, FIG. 5 is a circuit diagram of an injection-locked frequency divider according to a third embodiment of the present invention. Referring to FIG. 5, in the present embodiment, implementations of the source injection unit 30 and the transistors 121 and 122 may be described with reference to the first embodiment, and will not be repeated here. In particular, the active inductor unit 41 includes a first current source, a second current source and transistors 173, 174, 175 and 176. In the present embodiment, the first and second current sources are particularly explained using transistors 171 and 172 as an example. However, in other embodiments, the first and second current sources may be resistors. The transistors 171 and 172 are, for example, P-type metal-oxide-semiconductor transistors, and the transistors 173, 174, 175 and 176 are, for example, N-type metal-oxide-semiconductor transistors.

As described above, a first terminal and a gate terminal of the transistor 171 are respectively coupled to a voltage $V_{dd}$ and a bias voltage $V_{b1}$. A first terminal and a gate terminal of the transistor 173 are respectively coupled to the voltage $V_{dd}$ and a second terminal of the transistor 171. A first terminal and a gate terminal of the transistor 172 are respectively coupled to the voltage $V_{dd}$ and the bias voltage $V_{b1}$. A first terminal and a gate terminal of the transistor 174 are respectively coupled to the voltage $V_{dd}$ and a second terminal of the transistor 172. A first terminal, a gate terminal and a second terminal of the transistor 175 are respectively coupled to the second terminal of the transistor 172, and the gate terminal and the second terminal of the transistor 173. A first terminal, a gate terminal and a second terminal of the transistor 176 are respectively coupled to the second terminal of the transistor 171, and the gate terminal and the second terminal of the transistor 174.

Referring to FIG. 5, according to the principle of FIG. 4, the transistors 173 to 176 can be equivalent to a first inductor which is cross coupled between the ends B and C. In particular, in the present embodiment, the active inductor unit 41 can accomplish the first inductor by using the transistors 173 to 176 without a ground inductor. In other words, in the present embodiment, a ground terminal is not required for the active inductor unit 41 such that the flexibility of the circuit layout is increased. In addition, the technique described in the second embodiment may be used in the present embodiment to reduce the power consumption of the injection-locked frequency divider 13. Also, the present embodiment may achieve the efficacy similar to the first embodiment.

Figure 6:
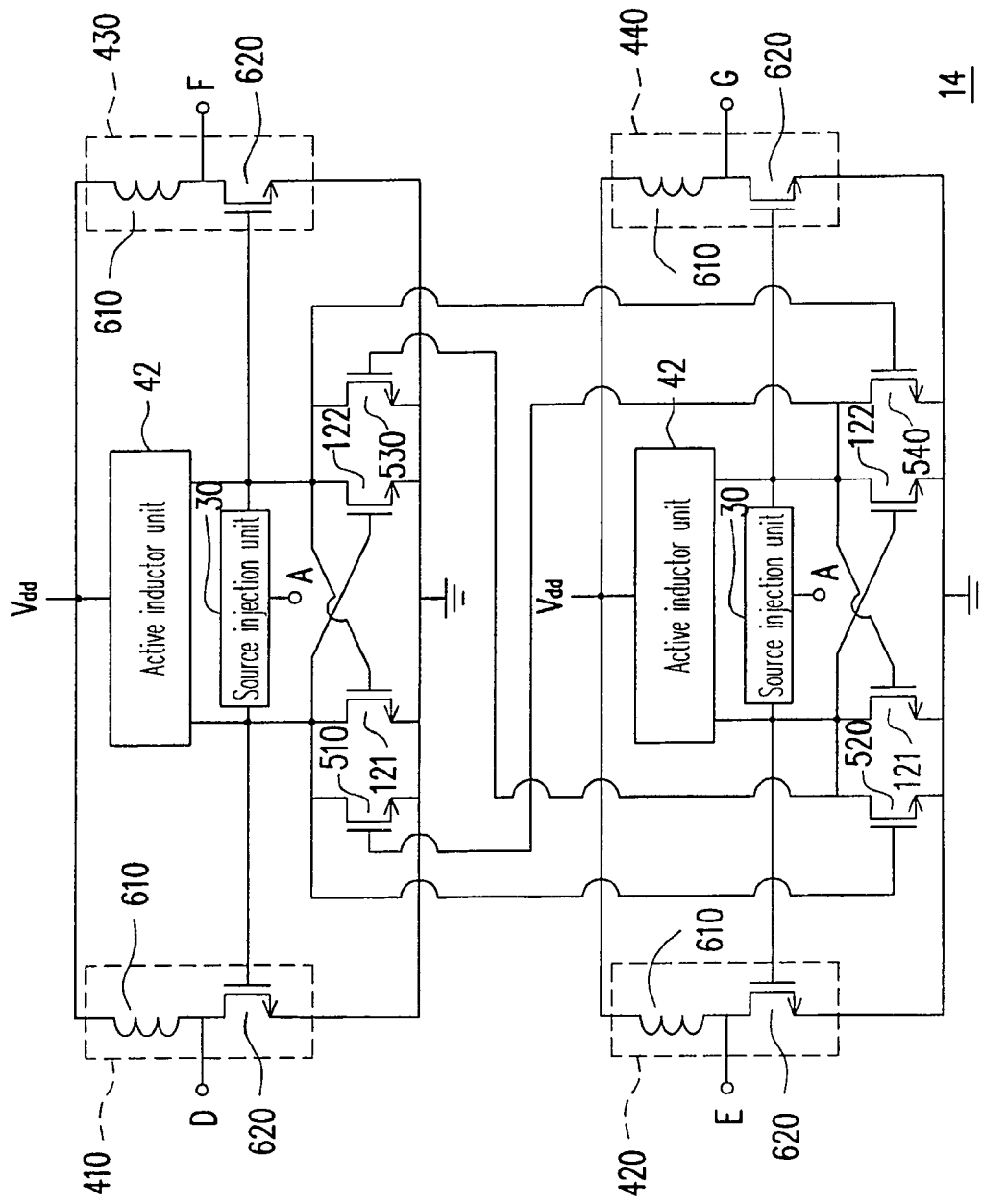
FIG. 6 is a circuit diagram of an injection-locked frequency divider capable of generating a four-phase signal, according to a fourth embodiment of the present invention.

FIG. 6 is a circuit diagram of an injection-locked frequency divider capable of generating a four-phase signal according to a fourth embodiment of the present invention. Referring to FIG. 6, in the present embodiment, the implementation of the active inductor unit 42 may be described with reference to the first or third embodiment, and the implementation of the source injection unit 30 and the transistors 121 and 122 may also be described with reference to the above-mentioned embodiments, so they are omitted. It should be noted that the injection-locked frequency divider 14 may include buffer units 410, 420, 430 and 440, and transistors 510, 520, 530 and 540. The buffer units 410, 420, 430 and 440 respectively include, for example, an inductor 610 and a transistor 620. We are aimed at this instance, the transistor 620 is an N-type metal-oxide-semiconductor transistor, and the inductor 610 may be a spiral inductor or an active inductor. The inductor 610 can serve as a load of the buffer units 410, 420, 430 and 440.

As described above, in the present embodiment, the transistors 510, 520, 530 and 540 are described using N-type metal-oxide-semiconductor transistors. The transistors 510, 520, 530 and 540 are coupled to each other such that the total phase of the injection-locked frequency divider 14 is 360°. And the injection-locked frequency divider 14 can output frequency-divided signals, which are orthogonal with each other, from ends D, E, F and G via the buffer units 410, 420, 430 and 440. Specifically, if the phase of a frequency-divided signal output from the buffer unit 410 is 0°, the phases of frequency-divided signals output from the buffer units 420, 430 and 440 are respectively 90', 180° and 270°. Thus, the injection-locked frequency divider 14 can not only achieve the efficacy similar to the first embodiment, but generate two groups of orthogonal signals, which is helpful to subsequent digital modulation.

Generally, the present invention employs an active inductor unit instead of the conventional spiral inductor to substantially reduce the chip area. In addition, the various embodiments of the present invention have at least the following advantages:

The induction value of the active inductor unit can be altered by adjusting the bias voltage $V_{b1}$ and/or the bias voltage $V_{b2}$ in the active inductor unit to substantially increase the locking frequency range of the injection-locked frequency divider.

The injection-locked frequency divider can operate in a high-frequency circuit, which makes it easy to integrate the injection-locked frequency divider into the high-frequency circuit.

The magnitude of current flowing through the injection-locked frequency divider can be limited via a transistor (for example, the transistor 310 of FIG. 3B) to reduce the power consumption of the injection-locked frequency divider, and thus reduce the generation of waste heat so that the stability of the system can be effectively promoted.

Two groups of orthogonal signals can be generated by using an injection-locked frequency divider for generating a four-phase signal, which is helpful to subsequent digital modulation.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. An injection-locked frequency divider, comprising:
a first active inductor unit, having a first terminal coupled to a first voltage;
a second active inductor unit, having a first terminal coupled to the first voltage;
a first source injection unit, having a first terminal for receiving a signal source, and a second terminal and a third terminal respectively coupled to a second terminal and a third terminal of the first active inductor unit;
a second source injection unit, having a first terminal for receiving the signal source, and a second terminal and a third terminal respectively coupled to a second terminal and a third terminal of the second active inductor unit;
a first transistor, having a first terminal, a gate terminal and a second terminal respectively coupled to the second terminal and the third terminal of the first source injection unit and a second voltage;
a second transistor, having a first terminal, a gate terminal and a second terminal respectively coupled to the third terminal and the second terminal of the first source injection unit and the second voltage;
a third transistor, having a first terminal, a gate terminal and a second terminal respectively coupled to the second terminal and the third terminal of the second source injection unit and the second voltage;
a fourth transistor, having a first terminal, a gate terminal and a second terminal respectively coupled to the third terminal and the second terminal of the second source injection unit and the second voltage;
a fifth transistor, having a first terminal, a second terminal and a gate terminal respectively coupled to the first terminal and a second terminal of the first transistor and the gate terminal of the third transistor;
a sixth transistor, having a first terminal, a second terminal and a gate terminal respectively coupled to the first terminal and the second terminal of the second transistor and the gate terminal of the fourth transistor;
a seventh transistor, having a first terminal, a second terminal and a gate terminal respectively coupled to the first terminal and a second terminal of the third transistor and the first terminal of the first transistor;
an eighth transistor, having a first terminal, a second terminal and a gate terminal respectively coupled to the first terminal and the second terminal of the fourth transistor and the first terminal of the second transistor;
a first buffer unit, having a first terminal, a second terminal and a third terminal respectively coupled to the first voltage, and the first terminal and the second terminal of the first transistor;
a second buffer unit, having a first terminal, a second terminal and a third terminal respectively coupled to the first voltage, and the first terminal and the second terminal of the second transistor;
a third buffer unit, having a first terminal, a second terminal and a third terminal respectively coupled to the first voltage, and the first terminal and the second terminal of the third transistor; and
a fourth buffer unit, having a first terminal, a second terminal and a third terminal respectively coupled to the first voltage, and the first terminal and the second terminal of the fourth transistor;
wherein the injection-locked frequency divider generates a frequency-divided signal having a half frequency of the signal source.

2. The injection-locked frequency divider of claim 1, wherein the first active inductor unit comprises:
a first current source, having a first terminal coupled to the first voltage;
a ninth transistor, having a first terminal, a second terminal and a gate terminal respectively coupled to the first voltage, the first terminal of the first transistor and a second terminal of the first current source;
a tenth transistor, having a first terminal, a gate terminal and a second terminal, respectively coupled to the gate terminal and the second terminal of the ninth transistor and a third voltage;
a second current source, having a first terminal coupled to the first voltage;
a eleventh transistor, having a first terminal, a second terminal and a gate terminal respectively coupled to the first voltage, the first terminal of the second transistor and a second terminal of the second current source; and
a twelfth transistor, having a first terminal, a gate terminal and a second terminal respectively coupled to the gate terminal and a second terminal of the eleventh transistor and the third voltage.

3. The injection-locked frequency divider of claim 2, wherein the first and the second current sources are transistors or resistors.

4. The injection-locked frequency divider of claim 2, wherein the first active inductor unit comprises:
a first resistor unit, coupled between the gate terminal of the ninth transistor, having a first terminal, a second terminal and a gate terminal respectively transistor and the first terminal of the tenth transistor; and
a second resistor unit, coupled between the gate terminal of the eleventh transistor and the first terminal of the twelfth transistor.

5. The injection-locked frequency divider of claim 4, wherein the first resistor unit comprises:
a first resistor, coupled between the gate terminal of the ninth transistor and the first terminal of the tenth transistor; and
a thirteenth transistor, having a first terminal, a second terminal and a gate terminal respectively coupled to the gate terminal of the ninth transistor, the first terminal of the tenth transistor and a bias voltage.

6. The injection-locked frequency divider of claim 5, wherein the second resistor unit comprises:
a second resistor, coupled between the gate terminal of the eleventh transistor and the first terminal of the twelfth transistor; and
an fourteenth transistor, having a first terminal, a second terminal and a gate terminal respectively coupled to the gate terminal of the eleventh transistor, the first terminal of the twelfth transistor and the bias voltage.

7. The injection-locked frequency divider of claim 4, wherein the first and the second resistor units are variable resistor units.

8. The injection-locked frequency divider of claim 1, wherein the first source injection unit comprises:
- a ninth transistor, having a gate terminal for receiving the signal source, and a first terminal and a second terminal respectively coupled to the second and third terminals of the first active inductor unit.

9. The injection-locked frequency divider of claim 1, further comprising:
- a ninth transistor, having a first terminal coupled to the second terminal of the first transistor and the second terminal of the second transistor, and a second, a gate terminal respectively coupled to the second voltage and a bias voltage.

10. The injection-locked frequency divider of claim 1, wherein the first active inductor unit comprises:
- a first current source, having a first terminal coupled to the first voltage;
- a ninth transistor, having a first terminal, a second terminal and a gate terminal respectively coupled to the first voltage and the first terminal of the first transistor and a second terminal of the first current source;
- a second current source, having a first terminal coupled to the first voltage;
- a tenth transistor, having a first terminal, a second terminal and a gate terminal respectively coupled to the first voltage and the first terminal of the second transistor and a second terminal of the second current source;
- a eleventh transistor, having a first terminal, a gate terminal and a second terminal respectively coupled to the second terminal of the second current source, and the gate terminal and the second terminal of the ninth transistor; and
- a twelfth transistor, having a first terminal, a gate terminal and a second terminal respectively coupled to the second terminal of the first current source, and the gate terminal and the second terminal of the tenth transistor.

11. The injection-locked frequency divider of claim 10, wherein the first and the second current sources are transistors or resistors.

12. The injection-locked frequency divider of claim 1, wherein the first and second active inductor units have the same structure, the first and second source injection units have the same structure, and the first to fourth buffer units have the same structure.

13. The injection-locked frequency divider of claim 12, wherein the first buffer unit comprises:
- an inductor, having a first terminal serving as the first terminal of the first buffer unit; and
- a ninth transistor, having a first terminal coupled to a second terminal of the inductor, and a second terminal and a third terminal serving as the second terminal and the third terminal of the first buffer unit.

* * * * *